(12) United States Patent
Van De Kerkhof et al.

(10) Patent No.: US 12,117,736 B2
(45) Date of Patent: Oct. 15, 2024

(54) LITHOGRAPHIC APPARATUS

(71) Applicant: ASML Netherlands B.V., Veldhoven (NL)

(72) Inventors: Marcus Adrianus Van De Kerkhof, Helmond (NL); Satish Achanta, Leuven (BE); Johannes Hubertus Josephina Moors, Roosteren (NL); Vadim Yevgenyevich Banine, Deurne (NL); Stef Marten Johan Janssens, Eindhoven (NL); Andrey Nikipelov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 379 days.

(21) Appl. No.: 17/621,472

(22) PCT Filed: Jun. 5, 2020

(86) PCT No.: PCT/EP2020/065577
§ 371 (c)(1),
(2) Date: Dec. 21, 2021

(87) PCT Pub. No.: WO2021/004705
PCT Pub. Date: Jan. 14, 2021

(65) Prior Publication Data
US 2022/0342315 A1 Oct. 27, 2022

(30) Foreign Application Priority Data
Jul. 8, 2019 (EP) .................................. 19184960

(51) Int. Cl.
*G03F 7/00* (2006.01)
*G03F 1/82* (2012.01)
(Continued)

(52) U.S. Cl.
CPC ................ *G03F 7/707* (2013.01); *G03F 1/82* (2013.01); *H01L 21/6831* (2013.01); *H01L 21/68721* (2013.01)

(58) Field of Classification Search
CPC . G03F 7/16; G03F 7/167; G03F 7/707; G03F 7/70783; G03F 7/7095;
(Continued)

(56) References Cited

U.S. PATENT DOCUMENTS

| | | |
|---|---|---|
| 5,793,474 A | 8/1998 | Nishi |
| 6,952,253 B2 | 10/2005 | Lof et al. |

(Continued)

FOREIGN PATENT DOCUMENTS

| | | |
|---|---|---|
| EP | 3299889 A1 | 3/2018 |
| TW | 201724350 A | 7/2017 |

OTHER PUBLICATIONS

Catherine Angioni, European International Searching Authority, International Search Report and Written Opinion, corresponding PCT Application No. PCT/EP2020/065577, mailed Oct. 5, 2020, 11 pages total.

*Primary Examiner* — Deoram Persaud
(74) *Attorney, Agent, or Firm* — DiBerardino McGovern IP Group LLC (57) ABSTRACT

A lithographic apparatus comprising: a clamping surface for supporting a substrate, wherein a property of the clamping surface is defined by at least one clamping surface parameter, and wherein the property of the clamping surface has been selected to exhibit low wear; a clamping apparatus for actuating a clamping operation between the clamping surface and the substrate, wherein the clamping operation is defined at least in part by at least one interface characteristic between the clamping surface and the substrate; and a processing station, operable to apply an adjustment to a first property of the substrate to optimize at least one interface (Continued)

characteristic of a particular clamping operation in dependence on the clamping surface parameter and at least one substrate surface parameter which defines a second property of the substrate.

19 Claims, 5 Drawing Sheets

(51) Int. Cl.
*H01L 21/683* (2006.01)
*H01L 21/687* (2006.01)

(58) Field of Classification Search
CPC . G03F 7/075; G03F 7/09; G03F 7/115; G03F 7/165; G03F 7/70691; G03F 1/82; G03F 7/70741; H01L 21/6715; H01L 21/6831; H01L 21/68721; H01L 21/68735; H01L 21/68757; H01L 21/67017; H01L 21/68714; C23C 16/4583; C23C 16/4584

See application file for complete search history.

(56) References Cited

U.S. PATENT DOCUMENTS

| | | | |
|---|---|---|---|
| 9,798,253 B2 * | 10/2017 | Van Sommeren | G03F 7/70716 |
| 11,086,232 B2 * | 8/2021 | Sciacca | G03F 9/7076 |
| 11,880,144 B2 * | 1/2024 | Hermanussen | G03F 7/70783 |
| 2002/0189940 A1 * | 12/2002 | Tsai | C30B 25/12 |
| | | | 118/724 |
| 2006/0097201 A1 | 5/2006 | Neerhof et al. | |
| 2018/0188660 A1 * | 7/2018 | Poiesz | G03F 7/707 |
| 2018/0308740 A1 | 10/2018 | Achanta et al. | |
| 2022/0342322 A1 * | 10/2022 | Van De Kerkhof | |
| | | | G03F 7/70733 |
| 2023/0333488 A1 * | 10/2023 | Bustraan | G03F 7/70716 |

* cited by examiner

LITHOGRAPHIC APPARATUS

CROSS-REFERENCE TO RELATED APPLICATIONS

This application claims priority of EP application 19184960.3 which was filed on Jul. 8, 2019 and which is incorporated herein in its entirety by reference.

FIELD

The present invention relates to a lithographic apparatus. In particular, it relates to a lithographic apparatus with a processing station operable to apply an adjustment to a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

The patterning device and/or substrate are typically held in place in the lithographic apparatus by clamping them to a clamping surface, for example using a vacuum, or using electrostatic forces. The clamping strength must be sufficient to hold the patterning device and/or substrate in place. It is known that clamping may cause deformation of the patterning device and/or substrate.

It may be desirable to provide a method and apparatus for improved clamping operations that overcomes one of the disadvantages associated with clamping a patterning device or substrate, whether mentioned above or otherwise. It may be desirable to provide an alternative method or apparatus for clamping a patterning device or substrate.

SUMMARY

According to a first aspect of the invention there is provided a lithographic apparatus comprising: a clamping surface for supporting a substrate, wherein a property of the clamping surface is defined by at least one clamping surface parameter; a clamping apparatus for actuating a clamping operation between the clamping surface and the substrate, wherein the clamping operation is defined at least in part by at least one interface characteristic between the clamping surface and the substrate; and a processing station, operable to apply an adjustment to a first property of the substrate to optimize at least one interface characteristic of a particular clamping operation in dependence on the clamping surface parameter and at least one substrate surface parameter which defines a second property of the substrate. The property of the clamping surface may have been selected to exhibit low wear.

The substrate may be, for example, a wafer, a mask, a reticle or other substrate within a lithographic apparatus. Previous attempts to optimize the interface characteristics have largely focused on controlling the clamping surface parameters, for example because a user has relatively free choice regarding their choice of substrate for use in a clamping operation. It has instead been realized that, by applying an adjustment to the substrate, the interface characteristics may be optimized more effectively than by solely considering the clamping surface.

Beneficially, by applying an adjustment to the substrate which depends on the clamping surface parameters, the interface characteristics can be optimized while retaining the low wear properties of the clamping surface. The properties required for a clamping surface to exhibit low wear (e.g. smoothness and/or stiffness and/or hardness) tend to result in other interface characteristics being sub-optimal. By providing a processing station to apply an adjustment to the substrate, a low-wear clamping surface may be retained while optimizing other interface characteristics. The interface characteristics to be optimized may differ depending on the requirements of the user.

Optimizing the interface characteristics may comprise reducing deformation of the substrate during a loading operation. As such, optimizing the interface characteristics may minimize stresses and/or deformations of the substrate, subsequently mitigating optical issues such as overlay issues. It may be beneficial to mitigate optical issues to increase the quality and throughput of lithographic processes Optimizing the interface characteristics may comprise increasing the strength of the clamping operation. For example, after the substrate has been clamped to the clamping surface, it may be accelerated, for example in a scanning operation in the lithographic apparatus. In applications with high accelerations, it may be beneficial to increase the strength of clamping, for example to improve locational control of the substrate during a scanning operation.

Optimizing the interface characteristics may comprise increasing the efficiency of an unloading operation (i.e. the clamping surface releasing the substrate).

Optimizing the interface characteristics may comprise further reducing the wear on the clamping surface. As such, optimizing the interface characteristics may increase the lifetime of the clamping surface. It is usual for each substrate to undergo many fewer clamping operations than a clamping surface (e.g. approximately 100 clamping operations per substrate as opposed to approximately 10 million clamping operations per clamping surface). It may be beneficial to increase the lifetime of the clamping surface to reduce costs, reduce maintenance frequency, and increase reliability of the lithographic apparatus.

The requirements of different optimizations may be conflicting, for example high friction between the clamping surface and the substrate may be beneficial to increasing the strength of clamping but detrimental to reducing deformation of the substrate and to wear on the clamping surface. Additionally, the requirements of the user may change, for example during different lithographic processes. This specification describes an apparatus and methods whereby the interface characteristics may be optimized for a range of requirements, while maintaining the low wear characteristics of the clamping surface.

The substrate may be a reticle, mask or wafer, for example a reticle or wafer associated with a lithographic exposure, or any other substrate within a lithographic apparatus. The first property of the substrate and the second property of the substrate may be the same property. The substrate surface parameter(s) may be measured, or they may be known.

The lithographic apparatus may further comprise a processing apparatus arranged to determine the substrate surface parameter defining the second property of the substrate. The processing station may comprise the processing apparatus. The processing apparatus may be, for example, a metrology apparatus. The processing apparatus may be any measurement device.

The first and/or second property may be selected from the group consisting of hardness, stiffness, roughness, geometry, work function, chemical surface state, surface energy, surface charge, humidity, hydrophobicity, surface particle density and lubrication.

The adjustment may be further based on at least one clamping parameter which defines, at least in part, the clamping operation.

The clamping parameter may be, for example, a speed, force or acceleration associated with the clamping operation. The clamping parameter may be in reference to a loading operation (i.e. the substrate first contacting the clamping surface and being clamped together), a scanning acceleration (i.e. the substrate being moved in response to the clamping surface being moved, e.g. in a scanning movement associated with a lithographic exposure) or an unloading operation (i.e. the substrate being released from the clamping surface).

Different clamping operations may have different clamping parameters, for example they beneficially may have different speeds. By applying an adjustment in view of a clamping parameter, the interface characteristics between the substrate and the clamping surface may be further optimized.

The property of the clamping surface may comprise at least one of: a hardness greater than 20 GPa, a stiffness greater than 200 GPa, a surface roughness less than 3 nm RMS, a surface energy lower than 25 mJ/m$^2$.

Beneficially, the clamping surface may be hard and/or smooth and/or stiff and/or have low surface energy. It may be desirable to select a property of the clamping surface to exhibit lower wear than a typical substrate, for example a silicon substrate. The property of the clamping surface may be defined by a clamping surface parameter. Stiffness may be measured in terms of Young's modulus.

Beneficially, a hardness greater than 20 GPa may reduce the wear of the clamping surface. The hardness may alternatively be greater than 40 GPa. The hardness may be measured, for example, using the Vickers hardness scale. Beneficially, a Young's modulus greater than 200 GPa may reduce the wear of the clamping surface. The Young's modulus may alternatively be greater than 250 GPa. For example, boron nitride may have a hardness of 48 GPa and a Young's modulus of 865 GPa. Boron-carbon-nitrogen ternary compounds may have a hardness in the range 30-76 GPa and a Young's modulus in the range 200-700 GPa. Diamond may have a hardness between 70-150 GPa and a Young's modulus of 1220 GPa.

The clamping surface may comprise an array of first ridges.

The ridges may, at least in part, define the geometry of the clamping surface. A clamping surface comprising said first ridges may beneficially reduce the effective surface area of the clamping surface. A reduced effective surface area may reduce adhesion between the clamping surface and the substrate. A reduced effective surface area in combination with a clamping surface chosen to exhibit low wear may further reduce wear on the clamping surface.

The ridges may be elongate, for example elongate within the plane of the clamping surface. The ridges may be generally parallel to each other. The ridges may be regularly arranged, for example each ridge may be approximately equidistant from each of its neighboring ridges. The ridges may comprise a wave-like pattern on the surface of the clamping surface.

The clamping surface may comprise a base, forming the overall global geometry of the surface, and a patterned structure adjacent the base, wherein, when receiving a substrate, the patterned structure is proximal to the substrate. The ridges may comprise the patterned structure.

The ridges may have a width. The width may reduce from a maximum width proximal to the base to a minimum width distal to the base. The width may change linearly from the maximum width to the minimum width. The width may change non-linearly from the maximum width to the minimum width. That is, the structure may have a curved profile. These width profiles may beneficially allow the effective surface area to change depending on applied pressure. For example, when a substrate is received by the clamping surface with low pressure, only a distal portion of the ridges may be in contact with the substrate. When a substrate is received by the clamping surface with high pressure (e.g. with a heavy load, or high applied forces such as electrostatic), the ridges and/or substrate may be deformed (e.g. elastically) such that the ridges are compressed and the contact area is increased. The contact area may range from zero to a maximum value, where the maximum value indicates the ridges and/or substrate are fully deformed.

The processing station may further comprise a patterning apparatus.

The patterning apparatus may comprise any apparatus operable to apply a pattern to the substrate. The pattern may comprise a surface texture. The pattern may comprise a roughness. The pattern may contribute to the geometry of the substrate. The patterning apparatus may comprise an ion beam. The patterning apparatus may comprise a chemical processing apparatus. The patterning apparatus may comprise an etching apparatus.

The processing station may be operable to form an array of second ridges on the substrate.

The ridges may be formed on the proximal surface of the substrate. The ridges may, at least in part, define the geometry of the substrate. A substrate comprising said second ridges may beneficially reduce the effective surface area of the substrate. A reduced effective surface area may reduce adhesion between the clamping surface and the substrate. A reduced effective surface area in combination with a clamping surface chosen to exhibit low wear may further reduce wear on the clamping surface The ridges may be elongate, for example elongate within the plane of the clamping surface. The ridges may be generally parallel to each other. The ridges may be regularly arranged, for example each ridge may be approximately equidistant from each of its neighboring ridges. The ridges may comprise a wave-like pattern on the surface of the clamping surface.

A substrate comprising said second ridges may beneficially reduce the effective surface area of the substrate for a given clamping force. A reduced effective surface area may reduce adhesion between the clamping surface and the substrate. The ridges may also beneficially allow control of the effective area of the substrate, e.g. through increases in the clamping force.

The ridges may comprise a wave-like pattern on the surface of the substrate. After being adjusted, the substrate may comprise a base, forming the overall global geometry of the substrate, and a patterned structure adjacent the base, wherein, when being receiving by the clamping surface, the patterned structure is proximal to the clamping surface. The ridges may comprise the patterned structure.

The ridges may have a width. The width may reduce from a maximum width proximal to the base to a minimum width distal to the base. The width may change linearly from the maximum width to the minimum width. The width may change non-linearly from the maximum width to the minimum width. That is, the structure may have a curved profile. These width profiles may beneficially allow the effective surface area to change depending on applied pressure. For example, when a substrate is received by the clamping surface with low pressure, only a distal portion of the ridges may be in contact with the clamping surface. When a substrate is received by the clamping surface with high pressure (e.g. with a heavy load, or high applied forces such as electrostatic), the ridges may be deformed (e.g. elastically) such that the ridges are compressed and the contact area is increased. The contact area may range from zero to a maximum value, where the maximum value indicates the ridges are fully deformed.

The clamping apparatus may be further operable to arrange the substrate and clamping surface in a clamping operation such that the first and second ridges cooperate to form a grid.

The clamping apparatus may be operable to arrange the substrate and clamping surface such that, when in a clamping operation, the second ridges are aligned at a non-zero angle with respect the first ridges. The cooperation of the first and second ridges to form a grid may result in a discrete number of contact points between the substrate and the clamping surface. A discrete number of contact points may reduce the contact area between the substrate and the clamping surface.

The first and second ridges may be generally perpendicular. By perpendicular, it should be understood that the first and second ridges are elongate within the same plane (i.e. the plane of the substrate) but are aligned generally perpendicularly within that plane. Aligning the ridges in this way provides a generally square grid shape. Aligning the ridges in this way may beneficially minimize the contact area between the clamping surface and the substrate.

The processing station may further comprise a cleaning apparatus to remove particles from the substrate.

The cleaning apparatus may be operable to clean the substrate. The cleaning apparatus may be operable to remove particles from the substrate. That is, the processing station may be operable to apply an adjustment wherein the adjustment comprises removing particles from the substrate.

Beneficially, cleaning the substrate may reduce wear of the clamping surface and substrate. Beneficially, cleaning the substrate may decrease deformation of the substrate during a clamping operation. The cleaning apparatus may comprise an ultrasonic jet cleaner, a CO2 dry-ice cleaner, or an electrostatic brushing cleaner. It may be beneficial to remove large particles (e.g. 1 micron and larger) so as to reduce local deformations. It may be beneficial to retain smaller particles (e.g. smaller than 1 micron). Retaining smaller particles may be beneficial e.g. for lubrication and/or hydrophobicity.

The processing station may further comprise a dehumidifier.

The dehumidifier may be operable to reduce the humidity of the substrate and/or in the vicinity of the substrate. Reducing the humidity of the substrate may beneficially reduce wear of the clamping surface. Reducing the humidity may reduce the occurrence of oxidation reactions occurring at the interface between the clamping surface and the substrate.

The dehumidifier may comprise, for example, an infrared heater, an ultraviolet radiation source, an active thermal conditioning system, a plasma exposure system, or any other suitable apparatus The processing station may further comprise an apparatus to apply a film to the substrate.

A film may contact the clamping surface as an intermediate layer between the substrate and the clamping surface. The film may have a lower hardness than the clamping surface and the substrate. The film may beneficially reduce wear of the clamping surface. The film may beneficially reduce wear of the substrate. The film may beneficially wear or deform under pressure. The film may be chosen so as not to yield loose debris under pressure. The film may comprise a metal oxide. A single film, or multiple layers of film (of comparable or different hardnesses), may be used.

A film may increase lubrication between the clamping surface and the substrate. The film may comprise molecular matter (e.g. alkanes and/or alcohol, silanes, hexamethyldisilazane (HDMS)) or a foil. The film may comprise carbon, for example a thin (few nanometer) carbon membrane or a carbon nanotube membrane.

A film may reduce or increase the roughness of a surface. For example, a smooth film may be applied to reduce the roughness of a surface.

The film may change the surface chemistry of the substrate. The film may terminate loose bonds on the surface. The film may comprise a surface layer of molecules. The surface layer of molecules may be applied to. Terminating loose bonds on the surface may beneficially reduce adhesion between the clamping surface and the substrate. The surface layer of molecules may comprise, for example, hydrogen or fluorine.

The film may reduce material transfer to the surface of the substrate during a clamping operation or in general maintenance of the apparatus. The film may comprise a surface layer of molecules. The surface layer may be adsorbed to the surface. The surface layer may be chosen so as to have sufficient vapor pressure that it does not leave the surface under vacuum, for example a long chain hydrocarbon, or an adhesion group hydrocarbon. The surface layer may comprise, for example, water, a hydrocarbon, HDMS, an alcohol, or an oil.

The film may increase the hydrophobicity of the substrate. For example, the film may comprise a surface layer of molecules, e.g. alkanes, alcohols, long-chain carbon molecules, hydrophobic silanes, self-assembled monolayers e.g. HDMS. Hydrophobicity may also be adjusted using plasma exposure. For example, by changing the type of gas used during a plasma exposure (e.g. Tetrafluoromethane (CF4), Silicon tetrafluoride (SiF4)), the hydrophobicity of the substrate may be changed.

The processing station may further comprise a charging apparatus.

The charging apparatus may be any apparatus operable to apply a charge to the substrate. Applying a charge to the substrate may beneficially reduce wear of the clamping surface. Applying a charge may reduce the occurrence of oxidation reactions occurring at the interface between the clamping surface and the substrate. The charge may be positive or negative or zero. An applied charge may reduce the net charge on the substrate. The charging apparatus may comprise, for example, an ion gun, an electron gun, an ionizer, and/or a biased counterelectrode, and/or any other suitable apparatus.

According to a second aspect there is provided a method for optimizing at least one interface characteristic of a clamping operation between a substrate and a clamping surface, the method comprising: adjusting a first property of the substrate in dependence on a clamping surface parameter defining the property of the clamping surface and a substrate surface parameter defining a second property of the substrate. The property of the clamping surface may have been selected to exhibit low wear.

The clamping operation is defined, at least in part, by the at least one interface characteristic.

Previous attempts to optimize the interface characteristics have largely focused on controlling the clamping surface parameters, for example because a user has relatively free choice regarding their choice of substrate for use in a clamping operation. It has instead been realized that, by applying an adjustment to the substrate, the interface characteristics may be optimized more effectively than by solely considering the clamping surface.

Beneficially, by applying an adjustment to the substrate which depends on the clamping surface parameters, the interface characteristics can be optimized while retaining the low wear properties of the clamping surface. The properties required for a clamping surface to exhibit low wear (e.g. smoothness and/or stiffness and/or hardness) tend to result in other interface characteristics being sub-optimal. By providing a processing station to apply an adjustment to the substrate, a low-wear clamping surface may be retained while optimizing other interface characteristics. The interface characteristics to be optimized may differ depending on the requirements of the user.

Optimizing the interface characteristics may comprise reducing deformation of the substrate during a loading operation. As such, optimizing the interface characteristics may minimize stresses and/or deformations of the substrate, subsequently mitigating optical issues such as overlay issues. It may be beneficial to mitigate optical issues to increase the quality and throughput of lithographic processes.

Optimizing the interface characteristics may comprise increasing the strength of the clamping operation. For example, after the substrate has been clamped to the clamping surface, it may be accelerated, for example in a scanning operation in the lithographic apparatus. In applications with high accelerations, it may be beneficial to increase the strength of clamping, for example to improve locational control of the substrate during a scanning operation.

Optimizing the interface characteristics may comprise increasing the efficiency of an unloading operation (i.e. the clamping surface releasing the substrate).

Optimizing the interface characteristics may comprise further reducing the wear on the clamping surface. As such, optimizing the interface characteristics may increase the lifetime of the clamping surface. It is usual for each substrate to undergo many fewer clamping operations than a clamping surface (e.g. approximately 100 clamping operations per substrate as opposed to approximately 10 million clamping operations per clamping surface). It may be beneficial to increase the lifetime of the clamping surface to reduce costs, reduce maintenance frequency, and increase reliability of the lithographic apparatus.

The requirements of different optimizations may be conflicting, for example high friction between the clamping surface and the substrate may be beneficial to increasing the strength of clamping but detrimental to reducing deformation of the substrate and to wear on the clamping surface. Additionally, the requirements of the user may change, for example during different lithographic processes. This specification describes an apparatus and methods whereby the interface characteristics may be optimized for a range of requirements, while maintaining the low wear characteristics of the clamping surface.

The substrate may be a reticle, mask or wafer, for example a reticle or wafer associated with a lithographic exposure, or any other substrate within a lithographic apparatus. The adjustment may be determined based on the substrate surface parameter. Determining the substrate surface parameter may comprise measuring a property of the substrate, for example using a metrology apparatus.

The clamping surface parameter may comprise at least one clamping surface parameter selected from the group consisting of hardness, stiffness, roughness, geometry, work function, chemical surface state, surface energy, surface charge, humidity, hydrophobicity, surface particle density and lubrication.

The clamping surface parameters may be considered a set of tribological parameters associated with the clamping surface. A clamping surface parameter may define a property of the clamping surface, for example numerically.

The substrate may be defined by a corresponding set of substrate surface parameters. A substrate surface parameter may define a property of the substrate, for example numerically.

An interface characteristic between the clamping surface and the substrate may be defined by a relationship between a clamping surface parameter and a corresponding substrate surface parameter.

The first and/or second property may be selected from the group consisting of hardness, stiffness, roughness, geometry, work function, chemical surface state, surface energy, surface charge, humidity, hydrophobicity, surface particle density and lubrication.

The first property of the substrate may be adjusted in dependence on at least one clamping parameter which defines, at least in part, the clamping operation.

The clamping parameter may be, for example, a speed, force or acceleration associated with the clamping operation. The clamping parameter may be in reference to a loading operation (i.e. the substrate first contacting the clamping surface and being clamped together), a scanning acceleration (i.e. the substrate being moved in response to the clamping surface being moved, e.g. in a scanning movement associated with a lithographic exposure) or an unloading operation (i.e. the substrate being released from the clamping surface).

Different clamping operations may have different clamping parameters, for example they may beneficially have different speeds. By applying an adjustment in view of a clamping parameter, the clamping operation may be further optimized.

The adjustment may comprise at least one of: forming an array of ridges on the substrate; removing particles from the substrate; applying a surface texture to the substrate; applying a soft film to the substrate; applying a charge to the substrate; and reducing the humidity of the substrate.

The ridges may be elongate within the plane of the substrate. The ridges may be parallel. The ridges may form an array. A substrate comprising said ridges may beneficially reduce the effective surface area of the substrate. A reduced effective surface area may reduce adhesion between the clamping surface and the substrate.

The ridges may comprise a wave-like pattern on the surface of the substrate. After being adjusted, the substrate may comprise a base, forming the overall global geometry of the substrate, and a patterned structure adjacent the base, wherein, when being receiving by the clamping surface, the patterned structure is proximal to the clamping surface.

The ridges may have a width. The width may reduce from a maximum width proximal to the base to a minimum width distal to the base. The width may change linearly from the maximum width to the minimum width. The width may change non-linearly from the maximum width to the minimum width. That is, the structure may have a curved profile. These width profiles may beneficially allow the effective surface area to change depending on applied pressure. For example, when a substrate is received by the clamping surface with low pressure, only a distal portion of the ridges may be in contact with the clamping surface. When a substrate is received by the clamping surface with high pressure (e.g. with a heavy load, or high applied forces such as electrostatic), the ridges may be deformed (e.g. elastically) such that the ridges are compressed and the contact area is increased. The contact area may range from zero to a maximum value, where the maximum value indicates the ridges are fully deformed.

Beneficially, the substrate may be arranged such that, when received by a clamping surface with an array of first ridges, the second ridges are aligned generally perpendicular to the first ridges. The orthogonal surface geometries of the first and second ridges may result in a discrete number of contact points between the substrate and the clamping surface. A discrete number of contact points may reduce the contact area between the substrate and the clamping surface.

Beneficially, cleaning the substrate may reduce wear of the clamping surface and substrate. Beneficially, cleaning the substrate may decrease deformation of the substrate during a clamping operation. The cleaning apparatus may comprise an ultrasonic jet cleaner, a CO2 dry-ice cleaner, or an electrostatic brushing cleaner. It may be beneficial to remove large particles (e.g. 1 micron and larger) so as to reduce local deformations. It may be beneficial to retain smaller particles (e.g. smaller than 1 micron). Retaining smaller particles may be beneficial e.g. for lubrication, hydrophobicity.

Applying a surface texture to the substrate may provide a high local roughness. A high local roughness may beneficially represent a higher local roughness than the roughness of the clamping surface, thereby reducing the wear of the clamping surface. A high local roughness may increase adhesion between the clamping surface and the substrate, thereby increasing the clamping strength. The local roughness may be, for example, greater than 3 nm RMS. The local roughness may be, for example, 5 nm RMS.

Roughness may be measured in terms of amplitude (deviation from a mean profile, e.g. measured in RMS) and frequency (related to the size of each deviation, e.g. measured in inverse distance). Each deviation may be considered a roughness feature. An average frequency greater than approximately 10-7 m−1 may be beneficial. An average frequency greater than approximately 10-7 m−1 may allow a similar clamping behavior across the surface. An average frequency greater than approximately 10-7 m−1 may create higher local friction. An average frequency greater than approximately 10-7 m−1 may reduce deformation of the substrate.

The frequency may be uniform (i.e. each roughness feature has a similar frequency) or irregular (i.e. adjacent roughness features may have different frequencies). Both uniform and irregular frequencies may have the same average frequency. A uniform frequency may result in higher deformation and/or higher wear. A uniform frequency may be beneficial for low pressure loading. An irregular frequency may result in lower deformation and/or reduced wear. A compromise between irregular and uniform frequency may be desirable.

A film may contact the clamping surface as an intermediate layer between the substrate and the clamping surface. The film may have a lower hardness than the clamping surface and the substrate. The film may beneficially reduce wear of the clamping surface. The film may beneficially reduce wear of the substrate. The film may beneficially wear or deform under pressure. The film may be chosen so as not to yield loose debris under pressure. The film may comprise a metal oxide. A single film, or multiple layers of film (of comparable or different hardnesses), may be used.

A film may increase lubrication between the clamping surface and the substrate. The film may comprise molecular matter (e.g. alkanes and/or alcohol, silanes, hexamethyldisilazane (HDMS)) or a foil. The film may comprise carbon, for example a thin (few nanometer) carbon membrane or a carbon nanotube membrane.

The film may change the surface chemistry of the substrate. The film may terminate loose bonds on the surface. The film may comprise a surface layer of molecules. The surface layer of molecules may be applied to. Terminating loose bonds on the surface may beneficially reduce adhesion between the clamping surface and the substrate. The surface layer of molecules may comprise, for example, hydrogen or fluorine.

The film may reduce material transfer to the surface of the substrate during a clamping operation or in general maintenance of the apparatus. The film may comprise a surface layer of molecules. The surface layer may be adsorbed to the surface. The surface layer may be chosen so as to have sufficient vapor pressure that it does not leave the surface under vacuum, for example a long chain hydrocarbon, or an adhesion group hydrocarbon. The surface layer may comprise, for example, water, a hydrocarbon, HDMS, an alcohol, or an oil.

The film may increase the hydrophobicity of the substrate. For example, the film may comprise a surface layer of molecules, e.g. alkanes, alcohols, long-chain carbon molecules, hydrophobic silanes, self-assembled monolayers e.g. HDMS. Hydrophobicity may also be adjusted using plasma exposure. For example, by changing the type of gas used during a plasma exposure (e.g. Tetrafluoromethane (CF4), Silicon tetrafluoride (SiF4)), the hydrophobicity of the substrate may be changed.

Applying a charge to the substrate may beneficially reduce wear of the clamping surface. Applying a charge may reduce the occurrence of oxidation reactions occurring at the interface between the clamping surface and the substrate. The charge may be positive or negative or zero. An applied charge may reduce the net charge on the substrate. Charge may be removed by ionization. Charge may be applied using an ion gun, an electron gun, an ionizer, and/or a biased counterelectrode, and/or any other suitable method.

Reducing the humidity of the substrate may beneficially reduce wear of the clamping surface. Reducing the humidity may reduce the occurrence of oxidation reactions occurring at the interface between the clamping surface and the substrate. Humidity may be removed by, for example, infrared heating, ultraviolet irradiation, active thermal conditioning (e.g. introducing a substrate to the system below the desired operating temperature and then bringing the substrate to a correct and uniform operating temperature) and/or plasma exposure, or any other suitable method.

The method may further comprise: receiving the clamping surface parameter; receiving the substrate surface parameter; and determining the adjustment in view of the clamping surface parameter and substrate surface parameter.

According to a third aspect of the invention there is provided a computer readable medium comprising instructions which, when executed by a computer, cause a substrate processing apparatus to perform any of the above methods.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
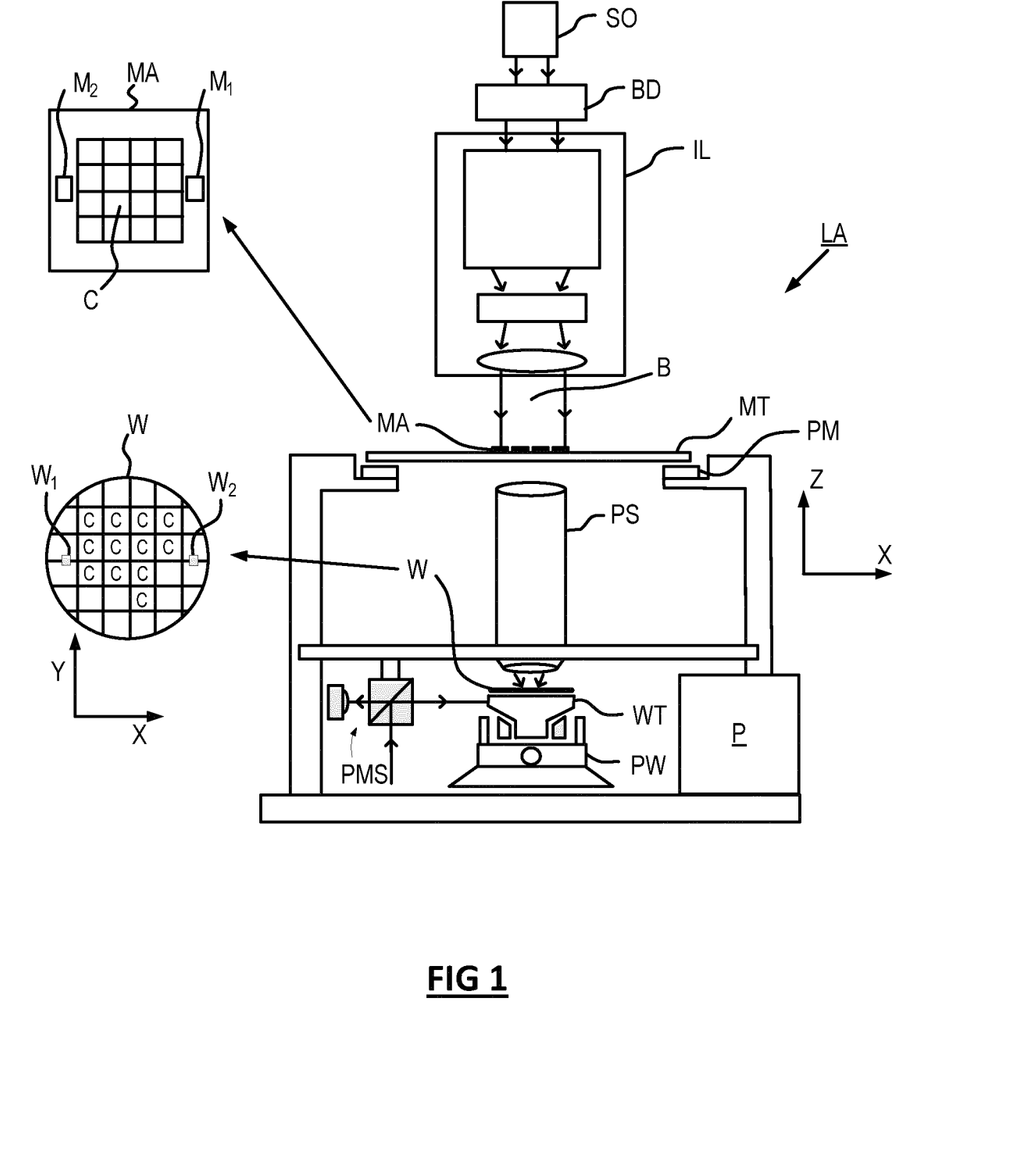
FIG. 1 schematically depicts a lithographic system comprising a lithographic apparatus and a radiation source.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to support a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

To clarify the invention, a Cartesian coordinate system is used. The Cartesian coordinate system has three axis, i.e., an x-axis, a y-axis and a z-axis. Each of the three axes is orthogonal to the other two axes. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

The lithographic apparatus LA may also comprise a processing station P operable to apply an adjustment to a substrate W or mask MA. The adjustment may change one or more properties of the substrate W or mask MA, for example a surface property e.g. surface charge or lubrication. The adjustment may optimize the substrate W or mask MA prior to a, or a portion of a, lithographic process.

In operation, the radiation beam B is incident on the patterning device, e.g. mask, MA which is supported on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

The mask MA may be held on the mask support MT by clamping. The substrate W may be held on the substrate support WT by clamping. Any suitable type of clamping may be used, for example electrostatic clamping or vacuum clamping. The clamping may be actuated by a clamping apparatus. Clamping may be referred to as a clamping operation.

The clamping operation may be defined at least in part by one or more clamping parameters. The clamping parameters may be, for example, a speed, force or acceleration associated with the clamping operation.

In some embodiments below, clamping may be discussed with reference to clamping the substrate W to the substrate support WT. In some embodiments below, clamping may be discussed with reference to clamping the mask MA to the mask support MT. It should be understood that the apparatus and processes described herein apply also to clamping any item to a portion of the lithographic apparatus or similar apparatus.

The process of clamping one item to another may be referred to as a clamping operation. A processing station P of the lithographic apparatus LA may be used to apply an adjustment to a substrate W or mask MA (or to another item to be clamped) to enable or improve a clamping operation. The processing station P may optionally comprise one or more positioning systems (for example comprising a positioner operable to move the substrate W or mask MA to or toward an active area, and optionally a position monitoring system to monitor the location of the substrate W or mask MA). The processing station P may comprise one or more processing mechanisms/apparatuses (e.g. cleaning apparatuses, heaters, ionizers etc.) and, optionally, one or more metrology and/or measurement systems. Example processing mechanisms/apparatuses are described in more detail below.

Clamping may be considered to comprise fixing an item in place. For example, the mask MA may be fixed in place with respect to the mask support MT by clamping. That is, given the Cartesian co-ordinate system in FIG. 1, the mask support MT may support the mask MA in the z-direction, whereas clamping may fix the mask MA in the x-direction and y-direction with respect the mask support MT. In other system configurations, the clamping may also fix the mask MA in the z-direction. It should be noted that the mask M, when clamped to the mask support MT may be moved within the x-direction, y-direction and z-direction by moving at least a portion of the mask support MT.

Figure 2:
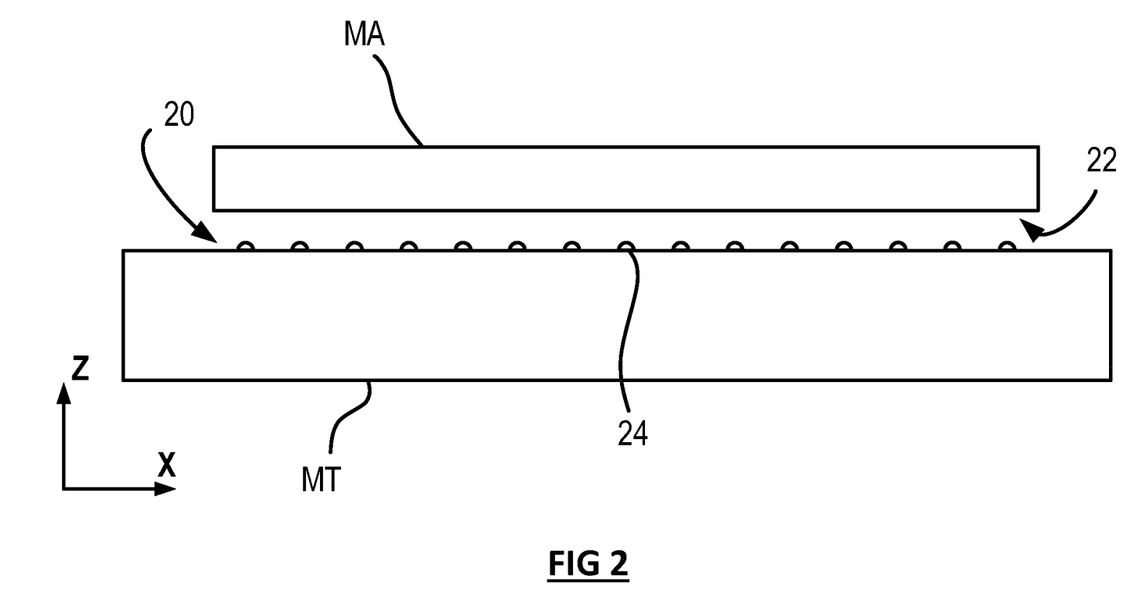
FIG. 2 schematically depicts a mask and mask support.

FIG. 2 shows a schematic example of a portion of a lithographic apparatus wherein a mask MA is to be clamped to the mask support MT. In operation, a force (e.g. electrostatic or vacuum) may cause the mask MA and mask support MT to come into contact. The portion of the mask support MT that is operable to contact a portion of the mask MA during a clamping operation may be referred to as a clamping surface 20. It should be noted that, while in FIG. 2, the clamping surface 20 and the mask support MT are unitary, they may alternatively be separate elements. The portion of the mask MA that is operable to contact a portion of the mask support MT may be referred to as the proximal surface 22 i.e. it is the surface of the mask MA proximal the clamping surface 20. The proximal surface 22 may be referred to as a substrate surface.

During a clamping operation there is an interaction between the clamping surface 20 and the proximal surface 22. The interaction may be referred to as an interface interaction or surface interaction. The interaction may be defined, at least in part, by one or more interface characteristics. The interface characteristics may depend on properties of the clamping surface 20 and proximal surface 22 as described in more detail below. The interface characteristics may be optimized as required by the user as described in more detail further below. A single interface characteristic may be optimized or multiple interface characteristics may be optimized.

The clamping surface 20 may be flat, or alternatively it may comprise additional structure e.g. protrusions 24 as depicted in FIG. 2. The protrusions 24 may be provided to reduce the contact area between the clamping surface 20 and the proximal surface 20 under certain clamping conditions (e.g. relatively weak clamping). The protrusions 24 may be any shape, for example but not limited to domes, waves or pyramidal shapes. The protrusions 24 may also be referred to as burls or pins.

The clamping surface 20 may be considered to have a base portion and a patterned portion or patterned structure. The base portion defines the general global geometry of the clamping surface 20 (which is flat in FIG. 2, but which may take other forms, such as undulating). The patterned portion defines smaller-scale features or smaller scale geometry upon the base portion (such as the burls 24 in FIG. 2). In FIG. 2, the burls 24 are separate but coterminous with the base portion. However, it should be understood that the clamping surface 20 may be formed such that the burls 24 are unitary with the base portion, for example by creating a molded or etched surface.

Figure 3:
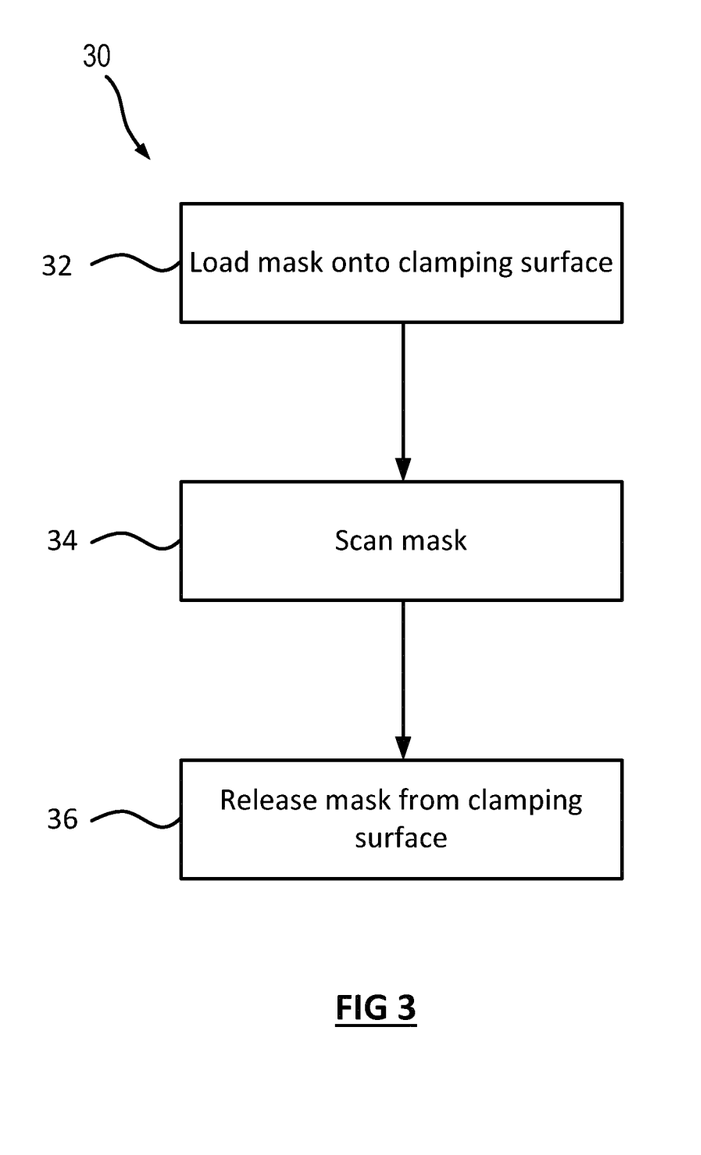
FIG. 3 illustrates a process of an example clamping operation.

There may be multiple stages in a clamping operation. FIG. 3 depicts a clamping operation 30 comprising a loading operation 32, a scanning operation 34 and an unloading operation 36. The mask MA may undergo a loading operation 32 where it is loaded onto the clamping surface 20, for example by applying a force such that the mask MA adheres to the clamping surface 20. The mask MA may then undergo a scanning operation 34, for example by moving the mask support MT such that the mask MA is moved. The scanning operation may be a lithographic scanning operation in combination with a lithographic exposure as described above and with reference to FIG. 1. The scanning operation may comprise acceleration and deceleration e.g. in the x-direction and y-direction. The mask MA may then undergo an unloading operation 36, wherein the mask MA is released from the clamping surface 20. Each of these stages may have different requirements regarding the interface characteristics between the clamping and proximal surfaces 20, 22.

The interface characteristics may depend on properties of the mask MA (i.e. the proximal surface 22) and properties of the clamping surface 20. The properties may be referred to as surface properties or surface characteristics. The properties may be defined by surface parameters. That is, each property may be defined by a corresponding parameter. The properties may represent a set of physical properties of the surface including, but not limited to: hardness, stiffness, roughness, geometry, work function, chemical surface state, surface energy, surface charge, humidity, hydrophobicity, surface particle density and lubrication.

The interface characteristics may also depend on the properties of the clamping operation. That is, the clamping operation may, at least in part, be defined by clamping parameters. The clamping parameters may be in reference to a loading operation (i.e. the substrate first contacting the clamping surface and being clamped together), a scanning acceleration (i.e. the substrate being moved in response to the clamping surface being moved, e.g. in a scanning movement associated with a lithographic exposure) or an unloading operation (i.e. the substrate being released from the clamping surface).

The clamping surface 20 may have one or more properties defined by one or more clamping surface parameters θ. The proximal surface 22 may have one or more properties defined by one or more substrate surface parameters Φ. The interaction (i.e. interface characteristics) between the clamping surface 20 and proximal surface 22 is at least partly dependent on the relationship between the properties of the clamping surface (and the clamping surface parameters θ) and the properties of the substrate (and the substrate surface parameters Φ). The interface characteristics between the clamping surface 20 and the proximal surface 22 may be described by a set of tribological properties e.g. wear, adhesion and friction.

These properties of the clamping surface 20 and the proximal surface 22 may affect the interface characteristics in a variety of ways. It may be beneficial to adjust one or more properties to alter the interface characteristics. Some of the ways in which the surface parameters may affect the interface characteristics are listed below:

hardness—if two surfaces have different hardnesses, the harder surface may cause the softer surface to wear and/or smooth with repeated contact between the two surfaces. This may reduce the lifetime of the softer surface. In some cases, a softer surface may yield loose debris when contacted by a harder surface (i.e. some small portions of the softer surface may be removed from the softer surface). Debris in the lithographic apparatus may reduce image quality of the lithographic apparatus, or require more regular maintenance to clean the apparatus. Hardness may be measured with reference to hardness scales, for example the Vickers Hardness Scale.

stiffness—if a stiff surface is involved in a clamping operation, it is possible for it to fracture when contacted by another surface. It may be beneficial to reduce the stiffness of a clamping surface. Stiffness may be measured, for example with reference to Young's modulus.

roughness—roughness (or surface roughness) is a measure of the small-scale texture of a surface. Small-scale may be considered to be on the order of nanometers to microns. A rough surface may comprise a number of small features on the surface which protrude from the surface. Roughness may be measured in terms of amplitude (i.e. vertical deviation of roughness features) and frequency (related to the size of each roughness feature). A large average amplitude may represent a high roughness. A high roughness may result in higher friction between two surfaces. A high roughness may result in higher wear of the rough surface. Roughness may also affect the contact area between two surfaces, i.e. the area of a first surface that contacts a second surface. A reduced contact area may result in increased wear and/or reduced friction. It should be noted that the contact area may be dependent on the applied load (e.g. force) which pushes two surfaces together. The contact area may be dependent on deformation of one or both of the surfaces (see stiffness above).

geometry—geometry (or surface geometry) may be considered a macroscale property compared to roughness. Geometry measures the larger-scale structure of a surface i.e. on the order of microns and larger. A clamping surface may have small-scale geometry e.g. surface features, and larger-scale geometry e.g. burls 24 and the general shape of the mask MA. Geometry may affect the contact area between two surfaces, i.e. the area of a first surface that contacts a second surface. A reduced contact area may result in increased wear and/or reduced friction. It should be noted that the contact area may be dependent on the applied load (e.g. force) which pushes two surfaces together. The contact area may be dependent on deformation of one or both of the surfaces (see stiffness above).

work function—if two surfaces have different work functions, there may be charge transfer between the two surfaces. It may be beneficial to reduce the difference in work function between the two surfaces in order to minimize or avoid charging. Surface charge may affect the wear of a surface. For example, surface charge may inhibit or encourage redox reactions. Reactions such as these may degrade the clamping surface and increase wear of the clamping surface.

chemical surface state or surface energy—the chemical surface state may depend on the surface energy of a surface (or correspondingly the interfacial energy between two surfaces). The surface energy may depend on chemical interactions, for example free atomic bonds at the surface (i.e. an unsatisfied valence on an atom, also known as a dangling bond or an unterminated bond). The surface energy may affect the adhesion between two surfaces. The chemical composition of a surface may also affect the surface energy of said surface.

surface charge—surface charge may affect the wear of a surface. For example, surface charge may inhibit or encourage redox reactions. Reactions such as these may degrade the surface.

humidity—humidity may affect the wear of a surface. For example, humidity may encourage redox reactions. Reactions such as these may degrade the surface.

hydrophobicity—hydrophobicity may reduce the surface energy of a surface (or correspondingly the interfacial energy between two surfaces). The surface energy may affect the adhesion between two surfaces.

surface particle density—large particles on a surface may cause deformation of the surface when interacting with another surface. Deformation may lead to optical aberration which may reduce imaging quality and/or throughput. Deformation may reduce overlay control. However, surface particles may also decrease the adhesion between two surfaces by reducing the effective contact area. Decreasing the adhesion between two surfaces may be beneficial to reduce friction. Surface particles may be considered contamination.

lubrication—lubrication may reduce the friction between two surfaces.

With further reference to FIG. 3, it may be beneficial to have a low friction between the surfaces 20, 22 during a loading operation 32. A low friction during a loading operation may minimize deformation of the mask MA. However, it may be beneficial to have a high friction between the surfaces 20, 22 during a scanning operation 34. During a scanning operation 34, the mask MA is accelerated and experiences forces due to its change in velocity. In order to have greater locational control over the mask MA as it is accelerated, it may be beneficial to increase the interaction strength between the surfaces 20, 22, for example by having a high friction between the surfaces 20, 22.

The desired interface characteristics defining the interaction between the surfaces 20, 22 may differ at between different stages of a clamping operation 30, leading to potentially conflicting requirements for selecting the clamping surface parameters θ and the substrate surface parameters Φ.

Furthermore, it may be beneficial to reduce the wear of the clamping surface. Users may choose any of a plurality of substrates or masks for use in a clamping operation. For example, a user may use substrates/masks with different substrate surface parameters Φ. A user may use substrates/masks from a variety of different suppliers, where the suppliers may not be the manufacturer of the lithographic apparatus. As a result, previous attempts to optimize the interaction have focused on controlling the properties of the clamping surface, in particular selecting clamping surface parameters suitable for use with a wide range of substrates/masks.

It is expected, however, that a clamping surface 20 may be used in a large number of clamping cycles (perhaps of the order of 10 million or more) during its lifetime. Example arrangements described herein provide increased lifetime of the clamping surface, thereby reducing costs, reducing maintenance frequency, and increasing reliability of a lithographic apparatus. In some example arrangements described herein, the properties of the substrate are controlled or adjusted in view of predetermined clamping surface parameters θ, which may be selected to improve wear, for example. In this way, the interface characteristics may be optimized more effectively than by solely considering the clamping surface parameters. In particular, the interaction may be optimized by applying an adjustment to the substrate dependent on clamping surface parameters θ and substrate surface parameters. Optimizing the interaction may comprise optimizing one or more interface characteristics. The adjustment may be applied using a processing station (see FIG. 1).

As previously mentioned, conflicting requirements may lead to significant design compromises. For example, previous attempts to optimize the interaction between the clamping surface 20 and the proximal surface 22 have focused on prioritizing friction requirements which may lead to increased wear. Specifically, this may lead to increased wear of the clamping surface 20.

In example arrangements discussed herein, the clamping surface 20 is optimized for low wear (i.e. so it exhibits low wear). Low wear may comprise a reduction in damage, deterioration, erosion and/or destruction during a clamping operation, or through repeated clamping operations.

By optimizing the clamping surface 20 for low wear, the interaction between the clamping surface 20 and the proximal surface 22 may be sub-optimal for a given clamping operation (in some cases, the clamping operation may not be possible). In example arrangements described herein, adjustments are made to the proximal surface 22 in view of the clamping surface 20 properties, to thereby optimize the interaction characteristics between the clamping surface 20 and the proximal surface 22 for the given clamping operation. Optimization of the interaction characteristics in this instance may be taken to represent an improvement in effectiveness of a given clamping operation.

Beneficially, the clamping surface 20 may be manufactured or processed to exhibit low wear and hence increase its lifetime. A clamping surface 20 which exhibits low wear may be manufactured or processed to have properties corresponding to low wear. Properties corresponding to low wear may be defined by clamping surface parameters θ corresponding to low wear. For example, the clamping surface 20 may be substantially hard (e.g. having a hardness of >20 GPa or >40 GPa), substantially rigid (e.g. having a Young's modulus of >200 GPa or >250 GPa), substantially smooth (e.g. having a roughness amplitude of <3 nm RMS), and have a relatively low surface energy (<25 mJ/m$^2$). The clamping surface 20 may be chosen to have a relatively low surface energy compared to a typical body that may be clamped to it, e.g. a substrate W.

A hardness greater than 20 GPa may reduce the wear of the clamping surface. The hardness may alternatively be greater than 40 GPa. The hardness may be measured, for example, using the Vickers hardness scale. Beneficially, a Young's modulus greater than 200 GPa may reduce the wear of the clamping surface. The Young's modulus may alternatively be greater than 250 GPa. For example, boron nitride may have a hardness of 48 GPa and a Young's modulus of 865 GPa. Boron-carbon-nitrogen ternary compounds may have a hardness in the range 30-76 GPa and a Young's modulus in the range 200-700 GPa. Diamond may have a hardness between 70-150 GPa and a Young's modulus of 1220 GPa. This list of materials should not be seen as limiting and any suitable material or materials may be used.

The clamping surface 20 may alternatively have properties which provide significantly lower wear than the properties of the proximal surface 22. That is, the clamping surface parameters θ define a surface which exhibits significantly lower wear relative to the substrate surface parameters Φ. For example, a typical substrate W may have a hardness of approximately 10 GPa, a Young's modulus of approximately 140 GPa, a surface roughness greater than 5 nm RMS. A typical substrate W may have a surface energy up to around 100 mJ/m$^2$.

Beneficially, by providing a processing station P and/or by applying an adjustment to the substrate W or mask MA, a low wear clamping surface 20 may be used while still allowing for optimization of the interface characteristics with regard to other elements of the clamping operation e.g. friction and adhesion.

Figure 4:
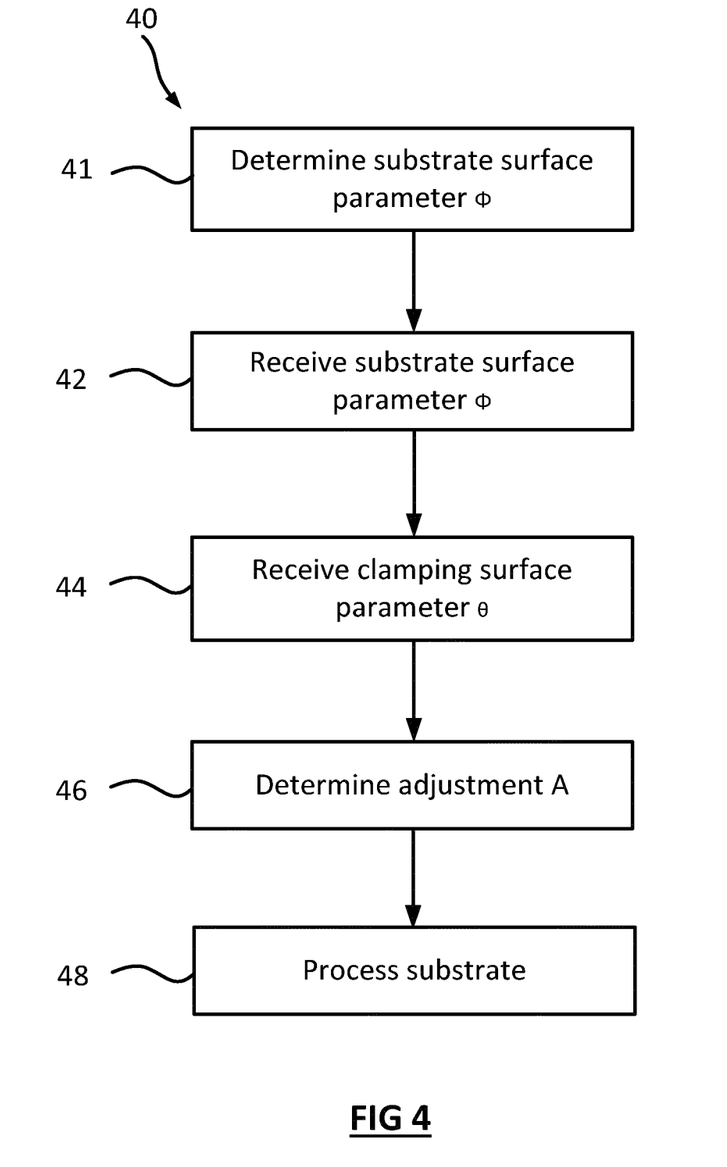
FIG. 4 illustrates a process of an example method to apply an adjustment to a substrate.

FIG. 4 illustrates an example method 40 for determining and applying an adjustment A to a substrate W. The method 40 and adjustment A may additionally or alternatively be applied to a mask MA or similar. The method 40 comprises determining 41 at least one substrate surface parameter Φ of the substrate W; receiving 42 said substrate surface parameter Φ; receiving 44 at least one clamping surface parameter θ; determining 46 an adjustment A based on the substrate and clamping surface parameters Φ, θ; and processing 48 the substrate W to adjust the substrate surface parameters Φ.

Determining 41 at least one substrate surface parameter Φ of the substrate W may comprise measuring one or more substrate surface parameters Φ, for example using a processing apparatus. The processing apparatus may be a metrology apparatus. The processing apparatus may form part of the processing station. In one example, an atomic force microscope may be used to determine a roughness of the substrate W. In another example, the Vickers Hardness test may be used to determine a hardness of the substrate W.

Receiving 42 at least one substrate surface parameter Φ and receiving 44 at least one clamping surface parameter θ may comprise receiving one or more parameters by a portion of a processing apparatus, for example a computer. The clamping surface parameter θ may be measured, for example similarly to that described above for determining 41 the substrate surface parameters Φ. Alternatively, the clamping surface parameters θ may be specified, for example by a manufacturer or user, and subsequently provided to the processing apparatus.

The processing apparatus then determines 46 an adjustment A. The adjustment A is dependent on at least one property of the clamping surface and at least one property of the substrate. The adjustment is determined in dependence of the received clamping surface parameters and substrate surface parameters θ, Φ. The adjustment A may generally comprise an alteration to the substrate in order to change an initial substrate surface parameter $\Phi_i$ to an adjusted substrate surface parameter $\Phi_f$. Given that the relationship between the initial substrate surface parameter $\Phi_i$ and the clamping surface parameter θ is different to the relationship between the adjusted substrate surface parameter $\Phi_f$ and the clamping surface parameter θ, the interface characteristics between the clamping surface 20 and the proximal surface 22 will be changed by the adjustment A. It will be appreciated that the adjustment A may take any of a number of possible forms and a number of example adjustments A are described in more detail further below.

The adjustment A may be determined using a processing station, which may for example comprise a computer. The adjustment A may be determined using a model. The model may model surface interactions. For example, a model may be used whereby one or more clamping surface parameters θ are fixed and one or more substrate surface parameters Φ are changed or fitted. The model may seek to optimize the interaction characteristics given a set of predetermined restraints.

Finally, the processing station applies 48 the adjustment A i.e. processes the substrate W given the adjustment A. Applying 48 the adjustment A may comprise processing (e.g. a making a physical or chemical change to) the substrate W in order to change the substrate surface parameter from an initial substrate surface parameter $\Phi_i$ to an updated substrate surface parameter $\Phi_f$. The processing station may comprise multiple elements operable to apply multiple adjustments. The processing station may comprise one or more of: a patterning apparatus, a cleaning apparatus, a dehumidifier, an apparatus to apply a film, a charging apparatus, or any other apparatus capable of applying an adjustment to the substrate W. Some example processing techniques are described in more detail below.

It should be noted that the steps of determining 41 a substrate surface parameter, receiving 42 the substrate surface parameter, receiving 44 a clamping surface parameter and/or determining 46 an adjustment A may be performed offline or externally to the processing station. As such, in some arrangements, the apparatus receive a pre-calculated adjustment and apply the adjustment 48 without the preceding steps illustrated in FIG. 4.

Specific adjustments A and processing techniques are described below, with reference to particular substrate surface parameters Φ and clamping surface parameters θ. The list below should not be seen as limiting, and other adjustments may be made which adjust one or more properties of the substrate without deviating from the scope of the claims. These processing techniques, may be performed using hardware, for example the processing station P as described with reference to FIG. 1. It should be understood that different processing techniques are not mutually exclusive, and multiple different processing techniques may be performed on the same substrate W.

Hardness—an adjustment A may reduce the hardness of the substrate W. For example, the hardness of the substrate W may be reduced such that it is lower than the hardness of the clamping surface 20. Beneficially, this may reduce wear of the clamping surface 20. An example of a processing technique that may reduce the hardness of the substrate is to apply a layer of material on the surface of the substrate W e.g. on the proximal surface 22. The layer of material may be referred to as a film. The film may have a hardness that is lower than the hardness of the clamping surface 20. A single layer of film or multiple layers of film may be applied. Preferably the film is chosen such that it does not yield loose particle debris during use. The film may be an organic material or an oxide. Such an organic material or oxide may beneficially be softer than the clamping surface, and not yield loose particle debris.

stiffness—the adjustment A may reduce the stiffness of the substrate W. A reduced stiffness of the substrate W may beneficially reduce damage to the substrate W when in contact with a clamping surface 20 that exhibits low wear. A reduced stiffness of the substrate W may beneficially reduce the risk of breakage of the substrate W. A processing technique that may reduce the stiffness of the substrate is to add alloying elements to the proximal surface 22.

roughness—the adjustment A may increase the roughness amplitude of the substrate W. An increased roughness amplitude may beneficially increase friction between the surfaces 20, 22 which may increase clamping strength and hence locational accuracy during a scanning operation. The adjustment A may comprise increasing the roughness amplitude of the substrate W to a roughness greater than the roughness amplitude of the clamping surface 20. Increasing the roughness amplitude to a roughness greater than that of the clamping surface 20 may increase the lifetime of the clamping surface, as a rougher surface may experience higher wear than a smoother surface i.e. wear is directed to the substrate W. A clamping surface 20 with a roughness amplitude less than 3 nm RMS and a proximal surface 22 with a roughness amplitude between 2-5 nm RMS (and greater than the roughness amplitude of the clamping surface 20) may be beneficial.

The adjustment A may increase the number of high frequency roughness features on the substrate W. High frequency roughness features may beneficially reduce the contact area between the two surfaces 20, 22. A reduced contact area may be beneficial during loading and unloading operations, as a reduced contact area may reduce friction and/or adhesion between the two surfaces. It has been found that high frequency features in excess of $10^{-7}$ $m^{-1}$ may be beneficial.

A processing technique to adjust the roughness may be to apply a film with a certain roughness to the substrate W.

Another processing technique to adjust the roughness may be to use lithography e.g. ion beam lithography, to apply a texture to the substrate W. Alternatively, chemical processing may be used to increase the roughness of the substrate W.

geometry—the adjustment A may alter the geometry of the substrate W. Altering the geometry of the substrate W may reduce the contact area between the substrate W and the clamping surface 20.

Figure 5:
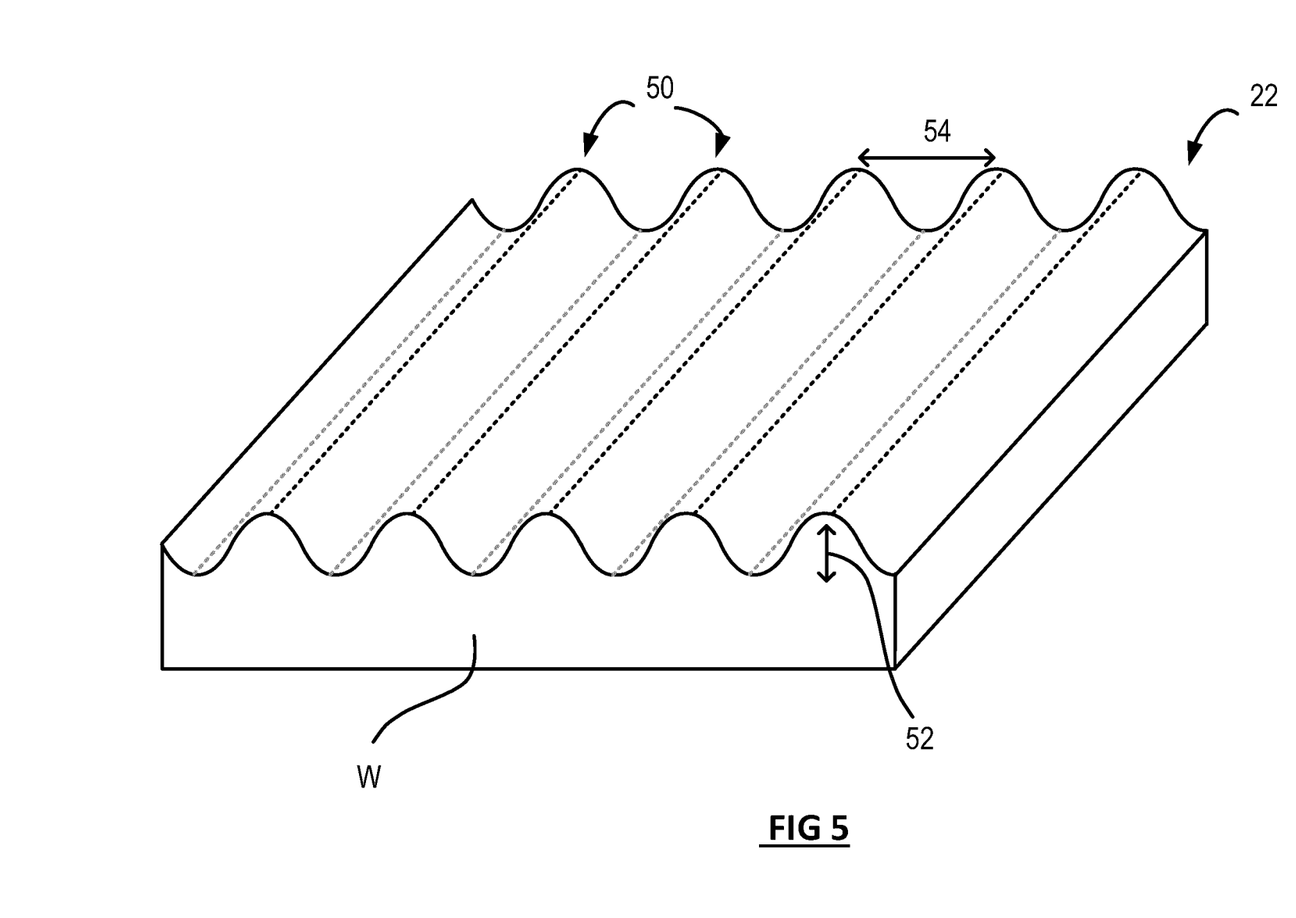
FIG. 5 schematically depicts a substrate following an adjustment.

In an example, the adjustment A may apply a wave-like structure to the proximal surface 22 as illustrated in FIG. 5. The structure comprises a series of ridges 50 extending perpendicularly from the proximal surface 22. The ridges 50 in this instance are linear and parallel. The ridges 50 may have a depth 52 (measured perpendicular to the proximal surface) on the order of nanometers. The distance 54 between adjacent ridges 50 may be on the order of microns. The application of ridges to the proximal surface 22 may form a finite number of contact regions between the proximal surface 22 and the clamping surface 20, providing a limited contact area between the two surfaces 20, 22.

The clamping surface 20 may be provided with a corresponding wave-like structure with clamping surface ridges similar to the proximal surface ridges 50. The proximal surface 22 may be received such that the clamping surface ridges are oriented at a non-zero angle to the proximal surface ridges 50. In this orientation, the ridges form a grid. In this orientation, a finite number of contact points are provided between the two surfaces 20, 22 providing a further limited contact area between the two surfaces. The ridges may be arranged such that the proximal surface ridges 50 are generally perpendicular to the clamping surface ridges. In this orientation, the grid forms an array of contact points in a generally square grid formation.

The ridges 50 may be deformable such that, when a load is applied, they compress.

Compressing the ridges 50 may therefore increase the contact area between the two surfaces 20, 22. In this way, the extent of the contact areas may be controlled during clamping operations to control the amount of friction between the surfaces 20, 22. For example, an increase in contact area and corresponding increase in friction can be achieved by application of a greater clamping force.

In an alternative example, the proximal surface may be received such that the clamping surface ridges are oriented parallel to the proximal surface ridges 50. In this orientation, the ridges may interlocate. Interlocated ridges may provide an increased contact area between the two surfaces. Interlocated ridges may increase the interface strength between the two surfaces 20, 22. Interlocated ridges may increase adhesion between the two surfaces 20, 22.

The orientation of the clamping surface 20 and proximal surface 22 may be altered using the clamping apparatus which is operable to actuate the clamping operation.

It should be understood that the ridges may be another shape than that depicted, for example with triangular or box-like cross-section.

An example processing technique to apply the ridges 50 is by way of ion beam lithography. The ion beam may be directed at a non-zero and non-perpendicular angle to the proximal surface 22 to form the wave-like structure. An alternative example processing technique to apply the ridges 50 is by way of applying a resist to the substrate W and creating an interference pattern in the resist, thereby creating the desired structure following an etching step. Another alternative example processing technique to apply ridges 50 is to etch the structure using a laser.

work function—an adjustment A may be to alter the work function of the proximal surface 22 such that it is closer to, or comparable to, the work function of the clamping surface 20. This may reduce or avoid charge transfer between the two surfaces 20, 22. A processing technique that may apply this adjustment A is to oxidize or reduce the surface. Another processing technique that may apply this adjustment A is to apply a surface layer with a different work function, for example an adsorbate layer, top layer, or film.

chemical surface state or surface energy—an adjustment A may be to reduce the surface energy of the proximal surface 22. An adjustment A may be to change the surface energy of the proximal surface 22 such that it is closer to, or comparable to, the surface energy of the clamping surface 20. A similar surface energy may reduce adhesion between the two surfaces 20, 22. An adjustment may alternatively be to increase the difference in surface energy of the two surfaces 20, 22. This adjustment may increase adhesion to the clamping surface 22, and hence increase clamping strength.

A processing technique to apply this adjustment A is to apply a surface layer of molecules. For example, applying fluorine to both surfaces 20, 22, or hydrogen to both surfaces 20, 22, may reduce adhesion between the two surfaces 20, 22. Alternatively, applying fluorine to one surface (e.g. the clamping surface 20) and hydrogen to another surface (e.g. the proximal surface 22) may increase the adhesion between the two surfaces 20, 22.

surface charge—an adjustment A may be to remove at least some of the charge from the proximal surface 22. Removing charge may beneficially reduce wear of the clamping surface 20. Example processing techniques that may be used to apply this adjustment A are using an ionizer, an ion gun, an electron gun, or an ionizer in combination with a biased counterelectrode.

humidity—an adjustment A may be to reduce or remove humidity from the proximal surface 22. Example processing techniques that may be used to apply this adjustment A are using infrared heating, ultraviolet radiation, or plasma exposure. The processing techniques may be used in combination. The processing techniques may be used in combination with active thermal conditioning of the substrate W, whereby the substrate W is introduced into the lithographic apparatus at a temperature below the desired operating temperature, and then brought to a correct and uniform operating temperature. The processing station may comprise a dehumidifier hydrophobicity—an adjustment A may be to increase the hydrophobicity of the proximal surface 22. Example processing techniques that may be used to apply this adjustment A are using plasma exposure (e.g. Tetrafluoromethane (CF4), Silicon tetrafluoride (SiF4)), exposure to alkanes and/or alcohols (optionally with long carbon chain molecules, which may be beneficial as long carbon chain molecules are stable in a vacuum), exposure to hydrophobic silanes, or the addition of self-assembled monolayers (e.g. bexamethyldisilazane (HMDS)).

surface particle density—an adjustment A may be to reduce the number of large particles (e.g. of >1 micron) on the proximal surface 22. Removing large particles may be beneficial to reduce deformation of the substrate W when in contact with the clamping surface 20. Example processing techniques to apply this adjustment are ultrasonic jet cleaning, carbon dioxide dry ice cleaning, non-contact electrostatic removal, or electrostatic brushing. It may be beneficial to remove at least some of the large particles, but not remove smaller particles (e.g. because the smaller particles may form a lubricating layer and/or form a barrier to inhibit strong bonds forming between the two surfaces 20, 22 which may thereby increase adhesion and/or wear). Processing techniques may be optimized to preferentially remove large particles and retain small particles on the proximal surface 22. A method that may be used to preferentially remove large particles and retain small particles is to use carbon dioxide dry ice cleaning and choose an appropriate size of dry ice pellets.

lubrication—an adjustment A may be to increase the lubrication between the proximal surface 22 and the clamping surface 20. This may subsequently reduce the friction between the surfaces 20, 22. A processing technique to apply this adjustment A may be to apply a layer of material on the proximal surface 22. For example, a thin film such may be applied. Multiple layers or a single layer may be applied. The layer may comprise, for example to alkanes and/or alcohols (optionally with long carbon chain molecules, which may be beneficial as long carbon chain molecules are stable in a vacuum), hydrophobic silanes, monolayers (e.g. hexamethyldisilazane (HDMS)), carbon membrane or carbon nanotube membranes.

An adjustment A may also be determined in dependence on at least one clamping parameter as well as at least one substrate surface parameter and at least one clamping surface parameter. For instance, the adjustment A may be determined in view of the applied clamping force or the speed of scanning.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lithographic apparatus comprising:
a clamping surface configured to support a substrate, wherein a property of the clamping surface is defined by at least one clamping surface parameter, and wherein the property of the clamping surface has been selected to exhibit low wear;
a clamping apparatus configured to actuate a clamping operation between the clamping surface and the substrate, wherein the clamping operation is defined at least in part by at least one interface characteristic between the clamping surface and the substrate; and
a processing station configured to apply an adjustment to a first property of the substrate to optimize at least one interface characteristic of a particular clamping operation, the adjustment depending on the clamping surface parameter and at least one substrate surface parameter which defines a second property of the substrate;
wherein the adjustment includes one or more of:
application of a patterned structure to the substrate,
application of a surface texture to the substrate,
removal of particles from the substrate,
application of a charge to the substrate, and
reduction of the humidity of the substrate.

2. The lithographic apparatus of claim 1, further comprising a processing apparatus configured to determine the substrate surface parameter defining the second property of the substrate.

3. The lithographic apparatus of claim 1, wherein the first and/or second property is selected from the group consisting of hardness, stiffness, roughness, geometry, work function, chemical surface state, surface energy, surface charge, humidity, hydrophobicity, surface particle density, and lubrication.

4. The lithographic apparatus of claim 1, wherein the adjustment is further based on at least one clamping parameter which defines, at least in part, the clamping operation.

5. The lithographic apparatus of claim 1, wherein the property of the clamping surface comprises at least one of: a hardness greater than 20 GPa, a stiffness greater than 200 GPa, a surface roughness less than 3 nm RMS, and a surface energy lower than 25 mJ/m$^2$.

6. The lithographic apparatus of claim 1, wherein the clamping surface comprises an array of first ridges.

7. The lithographic apparatus of claim 6, wherein the processing station further comprises a patterning apparatus.

8. The lithographic apparatus of claim 6, wherein the adjustment comprises applying the patterned structure to the substrate and the processing station is configured to apply the patterned structure by forming an array of second ridges on the substrate.

9. The lithographic apparatus of claim 1, wherein the processing station further comprises a cleaning apparatus configured to remove particles from the substrate to thereby apply the adjustment that removes particles from the substrate.

10. The lithographic apparatus of claim 1, wherein the processing station further comprises a dehumidifier to thereby apply the adjustment that reduces the humidity of the substrate.

11. The lithographic apparatus of claim 1, wherein the processing station further comprises an apparatus configured to apply a film to the substrate.

12. The lithographic apparatus of claim 1, wherein the processing station further comprises a charging apparatus to thereby apply the adjustment that applies the charge to the substrate.

13. A lithographic apparatus comprising:
- a clamping surface configured to support a substrate, the clamping surface comprising an array of first ridges, wherein a property of the clamping surface is defined by at least one clamping surface parameter, and wherein the property of the clamping surface has been selected to exhibit low wear;
- a clamping apparatus configured to actuate a clamping operation between the clamping surface and the substrate, wherein the clamping operation is defined at least in part by at least one interface characteristic between the clamping surface and the substrate; and
- a processing station including a patterning apparatus configured to apply an adjustment to a first property of the substrate to optimize at least one interface characteristic of a particular clamping operation in dependence on the clamping surface parameter and at least one substrate surface parameter which defines a second property of the substrate, the patterning apparatus configured to form an array of second ridges on the substrate,
- wherein the clamping apparatus is configured to arrange the substrate and clamping surface in a clamping operation such that the first and second ridges cooperate to form a grid.

14. The lithographic apparatus of claim 13, wherein the first and second ridges are generally perpendicular.

15. A method for optimizing at least one interface characteristic of a clamping operation between a substrate and a clamping surface, wherein a property of the clamping surface has been selected to exhibit low wear, the method comprising:
- receiving a clamping surface parameter defining the property of the clamping surface;
- receiving a substrate surface parameter defining a second property of the substrate;
- determining, based on the clamping surface parameter and the substrate surface parameter, an adjustment to a first property of the substrate; and
- adjusting the first property of the substrate according to the determined adjustment.

16. The method of claim 15, wherein the clamping surface parameter comprises at least one clamping surface parameter selected from the group consisting of hardness, stiffness, roughness, geometry, work function, chemical surface state, surface energy, surface charge, humidity, hydrophobicity, surface particle density, and lubrication.

17. The method of claim 15, wherein the first and/or second property is selected from the group consisting of hardness, stiffness, roughness, geometry, work function, chemical surface state, surface energy, surface charge, humidity, hydrophobicity, surface particle density, and lubrication.

18. The method of claim 15, wherein the first property of the substrate is adjusted in dependence on at least one clamping parameter which defines, at least in part, the clamping operation.

19. The method of claim 15, wherein the adjustment comprises at least one of:
- forming an array of ridges on the substrate;
- removing particles from the substrate;
- applying a surface texture to the substrate;
- applying a soft film to the substrate;
- applying a charge to the substrate; and
- reducing the humidity of the substrate.

* * * * *